US006540930B2

(12) United States Patent
Kesari et al.

(10) Patent No.: US 6,540,930 B2
(45) Date of Patent: Apr. 1, 2003

(54) USE OF PERFLUOROKETONES AS VAPOR REACTOR CLEANING, ETCHING, AND DOPING GASES

(75) Inventors: Susrut Kesari, St. Paul, MN (US); Fred E. Behr, Woodbury, MN (US); Michael G. Costello, Afton, MN (US); Richard M. Flynn, Mahtomedi, MN (US); Richard M. Minday, Stillwater, MN (US); John G. Owens, Woodbury, MN (US); Daniel R. Vitcak, Cottage Grove, MN (US); Larry A. Zazzera, Edina, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 135 days.

(21) Appl. No.: 09/841,376

(22) Filed: Apr. 24, 2001

(65) Prior Publication Data

US 2003/0019841 A1 Jan. 30, 2003

(51) Int. Cl.$^7$ .................................. H01L 21/00
(52) U.S. Cl. ................ 216/67; 216/79; 134/1.1; 134/22.1
(58) Field of Search ............... 216/37, 63, 67, 216/73, 79; 438/905, 906; 134/1.1, 1.2, 21, 22.1

(56) References Cited

U.S. PATENT DOCUMENTS

| 4,067,884 | A | | 1/1978 | Martini | 260/340.6 |
| 5,247,101 | A | | 9/1993 | Takago et al. | 549/347 |
| 5,466,877 | A | | 11/1995 | Moore | 562/852 |
| 6,291,417 | B1 | * | 9/2001 | Flynn et al. | 510/412 |
| 6,394,107 | B1 | * | 5/2002 | Kesari et al. | 134/22.1 |

FOREIGN PATENT DOCUMENTS

| JP | 6-163476 | 6/1994 |
| JP | 8-291299 | 11/1996 |
| JP | 2904723 | 3/1999 |
| JP | 00-265197 A | 9/2000 |
| WO | WO 98/01899 | 1/1998 |
| WO | WO 01/05468 | 1/2001 |

* cited by examiner

Primary Examiner—Allan Olsen
(74) Attorney, Agent, or Firm—Robert H. Jordan

(57) ABSTRACT

Methods of using reactive gases containing a perfluoroketone having 4 to 7 carbon atoms for removing unwanted deposits that build up in a vapor reactor, for etching dielectric and metallic materials in a vapor reactor, and for doping a material in a vapor reactor are described. The perfluoroketones perform as well as or better than the standard perfluorocarbons used in the semiconductor industry but have minimal impact on global warming.

15 Claims, No Drawings

USE OF PERFLUOROKETONES AS VAPOR REACTOR CLEANING, ETCHING, AND DOPING GASES

FIELD OF INVENTION

The invention relates to methods of using perfluoroketone as a reactive gas for removing unwanted deposits that build up in a vapor reactor, for etching dielectric or metallic materials in a vapor reactor, and for doping various materials in a vapor reactor.

BACKGROUND OF THE INVENTION

The emission of global warming gases has received worldwide attention. The goal of the Kyoto Protocol, established at the United Nations Conference on Global Warming, was to lower emissions of carbon dioxide, methane, nitrous oxide, perfluorocarbon (PFC), hydrofluorocarbon (HFC), and $SF_6$ to pre-1990 levels. Additionally, most manufacturers of semiconductors in the United States have signed a Memorandum of Understanding with the Environmental Protection Agency pledging to evaluate options for reducing PFC emissions. Perfluorocarbons and perfluorinated nitrogen compounds typically used in the semiconductor industry include $CF_4$, $C_2F_6$, $NF_3$, and $C_3F_8$. These materials are extremely stable compounds and are difficult to trap or treat with gas scrubbers.

Chemical vapor deposition chambers, physical vapor deposition chambers, and etching chambers are widely used in the semiconductor industry in connection with the manufacture of various electronic devices and components. Such chambers use reactive gases or vapors to deposit, pattern, or remove various dielectric and metallic materials. Perfluorocarbons and perfluorinated nitrogen compounds are widely used in conjunction with vapor reactors for etching or patterning materials and for removing unwanted deposits that build-up on the reactor walls and parts. The semiconductor industry needs alternative chemicals for vapor reaction techniques that do not contribute to global warming. This invention provides methods of using a perfluoroketone in a vapor reactor as a reactive gas to remove unwanted deposits, to etch dielectric and metallic materials, and to dope materials. The perfluoroketones perform as well as or better than perfluorocarbons while offering the advantage of significantly lower global warming potential. Additionally, the perfluoroketones are less toxic than $NF_3$, another gas widely used in the semiconductor industry for cleaning purposes.

SUMMARY OF THE INVENTION

The invention provides a method for cleaning a chemical vapor deposition chamber, a physical vapor deposition chamber, or an etching chamber using a reactive gas comprising a perfluoroketone with 4 to 7 carbon atoms. The perfluoroketone is generally mixed with oxygen gas and a radio frequency plasma is generated. Both the cleaning time and global warming emissions are dependent on the power used to generate the plasma, the pressure inside the chamber, the gas flow rate, and the ratio of perfluoroketone to oxygen. The use of the perfluoroketone cleaning gas can result in shorter cleaning times and lower PFC emissions compared to the standard cleaning gases used by the semiconductor industry such as $CF_4$, $C_2F_6$, c-$C_4F_8O$, and $C_3F_8$.

The invention also provides a method for etching a dielectric or metallic material using a reactive gas comprising a perfluoroketone with 4 to 7 carbon atoms. The rate of etching is comparable to that of materials commonly used for etching in the semiconductor industry such as $CF_4$, $C_2F_6$, c-$C_4F_8O$ and $C_3F_8$.

Another aspect of the invention provides a method for using a reactive gas comprising a perfluoroketone with 4 to 7 carbon atoms as a source of fluorine for preparation of fluorine containing or fluorine doped materials.

DETAILED DESCRIPTION OF ILLUSTRATIVE EMBODIMENTS OF THE INVENTION

The invention provides methods of using a perfluoroketone as a reactive cleaning gas, etchant, and dopant in a vapor reactor. As used herein, the term "vapor reactor" includes chemical vapor deposition chambers, physical vapor deposition chambers, and etching chambers. Such reactors use reactive gases or vapors to deposit, pattern, or remove various dielectric and metallic materials. In particular, the invention provides a method for using a reactive gas comprising a perfluoroketone with 4 to 7 carbon atoms for in situ cleaning of a vapor reactor. The invention also provides a method for using a reactive gas comprising a perfluoroketone with 4 to 7 carbon atoms as an etchant to pattern or remove dielectric and metallic materials. Additionally, the invention provides a method for using a reactive gas comprising a perfluoroketone with 4 to 7 carbon atoms as a source of fluorine to prepare fluorine containing or fluorine doped materials.

The perfluoroketones of this invention have a boiling point less than about 80° C. The compounds can be linear, branched, or cyclic and contain 4 to 7 carbon atoms. Preferably, the perfluoroketones contain 5 to 7 carbon atoms. Representative examples of perfluoroketone compounds include $CF_3C(O)CF_2CF_3$, $CF_3CF_2C(O)CF_2CF_3$, $CF_3C(O)CF(CF_3)_2$, $CF_3CF_2C(O)CF(CF_3)_2$, $CF_3(CF_2)_2C(O)CF(CF_3)_2$, $(CF_3)_2CFC(O)CF(CF_3)_2$, $CF_3(CF_2)_2C(O)CF_2CF_2CF_3$, perfluorocyclopentanone, an perfluorocyclohexanone.

Perfluoroketones can be prepared by known methods. One approach involves the dissociation of perfluorinated carboxylic acid esters of the formula $R_fCO_2CF(R_f)_2$ with a nucleophilic initiating agent as described in U.S. Pat. No. 5,466,877 (Moore). $R_f$ and $R_f$ are fluorine or a perfluoroalkyl group. The fluorinated carboxylic acid ester precursor can be derived from the corresponding fluorine-free or partially fluorinated hydrocarbon ester by direct fluorination with fluorine gas as described in U.S. Pat. No. 5,399,718 (Costello et al.).

Perfluorinated ketones that are alpha-branched to the carbonyl group can be prepared as described in U.S. Pat. No. 3,185,734 (Fawcett et al.). Hexafluoropropylene is added to acyl halides in an anhydrous environment in the presence of fluoride ion. Small amounts of hexafluoropropylene dimer and/or trimer impurities can be removed by distillation from the perfluoroketone. If the boiling points are too close for fractional distillation, the dimer and/or trimer impurity can be removed by oxidation with alkali metal permanganate in a suitable organic solvent such as acetone, acetic acid, or a mixture thereof. The oxidation reaction is typically carried out in a sealed reactor at ambient or elevated temperatures.

Linear perfluorinated ketones can be prepared by reacting a perfluorocarboxylic acid alkali metal salt with a perfluorocarbonyl acid fluoride as described in U.S. Pat. No. 4,136,121 (Martini et al.) Such ketones can also be prepared by reacting a perfluorocarboxylic acid salt with a perfluorinated acid anhydride in an aprotic solvent at elevated temperatures as described in U.S. Pat. No. 5,998,671 (Van Der Puy).

All the above-mentioned patents describing the preparation of perfluoroketones are incorporated by reference in their entirety.

In the manufacture of various electronic devices or components, vapor reactors are used for depositing as well as etching dielectric and metallic materials. With both deposition and etching processes, unwanted deposits can build-up on the reactor walls and parts over time. These deposits are a source of potential contamination of the electronic device and components being produced in the vapor reactor. Thus, these unwanted deposits must be removed periodically. The deposits can include fluoropolymers containing carbon, hydrogen, oxygen, and fluorine if perfluorochemicals or hydrofluorochemicals have been used in the vapor reactor. The deposits can also contain silicon-based materials as well as various metallic materials such as, for example, tungsten and aluminum. As used herein, the term "cleaning" refers to removing the unwanted deposits that build up over time on the walls and parts of a vapor reactor.

The invention provides a method for cleaning vapor reactors using a reactive gas comprising a perfluoroketone having a boiling point less than 80° C. and containing 4 to 7 carbon atoms. Preferably, the perfluoroketone contains 5 to 7 carbon atoms. Typically, the perfluoroketone is combined with oxygen and a radio frequency plasma is generated resulting in the formation of various radicals such as atomic fluorine, carbon difluoride, and carbon trifluoride. A stable plasma can be sustained with the perfluoroketones of the invention.

The use of a cleaning gas comprising a perfluoroketone can result in shorter cleaning times and lower global warming emissions compared to the standard gases used to clean vapor reactors such as $C_2F_6$ and $C_3F_8$. Both the cleaning time and global warming emissions are dependent on the power used to generate the plasma, the pressure inside the vapor reactor, the gas flow rate, and the ratio of perfluoroketone to oxygen.

The volumetric ratio of perfluoroketone to oxygen typically ranges from about 0.10 to about 0.90, and preferably from about 0.30 to about 0.70, to 1.0 of oxygen gas ($O_2$). The ratio of perfluoroketone to oxygen affects which radicals form in the plasma as well as which by-products form during the etching process. The perfluoroketone is typically destroyed quickly in the plasma. One of the primary by-products of the process is $COF_2$, a gas that can be removed from the exhaust with a scrubber containing water. Lower ratios of perfluoroketone to oxygen favor the formation of atomic fluorine and $COF_2$ as by-products rather than $CF_4$. Other by-products include carbon dioxide, carbon monoxide, hydrofluoric acid, and possibly fluorine. Either no or negligible quantities of $C_2F_6$ or $C_3F_8$ are produced as by-products of the reactions in the vapor reactor.

The power used to generate the perfluoroketone/oxygen plasma is typically in the range of about 200 to about 3500 watts. Typically, the gas flow rate is in the range of about 10 $cm^3$/min to about 1000 $cm^3$/min with the pressure in the range of about 0.1 torr-absolute to about 10 torr-absolute. Lower gas flow rates tend to increase cleaning times and reduce global warming gas emissions. Higher gas flow rates tend to decrease cleaning times but also increase PFC emissions.

The cleaning gas can contain a single perfluoroketone, a mixture of perfluoroketones, or a mixture of a perfluoroketone with other gases including other perfluorochemicals such as, for example, $F_2$, $NF_3$, c-$C_4F_8O$, $CF_4$, $C_2F_6$, $C_3F_8$, $SF_6$, $CF_3SF_5$ and $CF_2$=CF—CF=$CF_2$.

The invention also provides a method for etching a dielectric or metallic material in a vapor reactor by contacting such material with a reactive gas comprising a perfluoroketone having a boiling point less than about 80° C. and containing 4 to 7 carbon atoms. Preferably the perfluoroketone contains 5 to 7 carbon atoms. The perfluoroketone is typically mixed with oxygen gas and a radio frequency plasma is generated resulting in the formation of various radicals such as atomic fluorine, carbon difluoride, and carbon trifluoride. The plasma conditions are similar to those described above.

The material that is etched by the perfluorinated ketone/oxygen plasma can include a variety of dielectric and metallic materials but typically comprises silicon-based materials such as, for example, silica, silicon oxide, silicon carbide, and silicon nitrides. The silicon-based material can be doped with boron, phosphorus, arsenic, and the like. The radicals in the plasma react with the silicon-based material to form a volatile compound such as $SiF_4$. The $SiF_4$ and other by-products are swept out of the reactor as part of the exhaust gas. The rate of etching by the perfluoroketones is comparable to that of perfluorocarbons commonly used for etching in the semiconductor industry such as $CF_4$, $C_2F_6$, and $C_3F_8$.

The mass of etching gas delivered to the vapor reactor and exiting the reactor can be used to calculate the utilization efficiency of the etching gas. As used herein, the "utilization efficiency" refers to the percentage of the etching gas that reacts to form other products. A higher utilization efficiency generally correlates with lower emissions of the etching gas. The utilization efficiency is dependent upon the structure of the etching gas and the amount of radio frequency power (RF power) used to generate the plasma. Normally, higher RF power yields higher utilization efficiencies.

The perfluoroketone etching gases of the invention generally have higher utilization efficiencies than state-of-the-art fluorinated materials used such as $CF_4$, $C_2F_6$, $C_3F_8$ and c-$C_4F_8O$. A large portion of the perfluoroketone is destroyed in the plasma. Typically, the utilization efficiency is greater than about 35% for the perfluoroketones of the invention and is similar for branched and linear molecules.

Higher utilization efficiency of the etching gas results in manufacturing processes that require less fluorine source gas. This subsequently leads to lower total perfluorocarbon (PFC) containing gas emissions. The gaseous by-products from plasma etching with a perfluoroketone contain no or only negligible quantities of perfluoroketone, $C_2F_6$ or $C_3F_8$. Moreover, there are lower levels of $CF_4$ than with conventional PFC etching gases. Thus, the use of plasmas generated by mixing oxygen and perfluoroketones could be used to meet the goals of the semiconductor industry to reduce emissions of PFC compounds.

Another aspect of the invention provides a method for using a gas comprising a perfluoroketone having a boiling point less than about 80° C. containing 4 to 7 carbon atoms as a source of fluorine for the deposition of fluorine containing or fluorine doped materials. Preferably, the perfluoroketone contains 5 to 7 carbon atoms. The perfluoroketone is typically mixed with oxygen gas and a radio frequency plasma is generated. The plasma conditions are similar to those described above.

Such a process can be used, for example, to lower the dielectric constant of a film on a wafer support by doping the film with both carbon and fluorine.

The perfluoroketones of the invention have much lower global warming potential (GWP) than the conventional perfluorocarbons used in the semiconductor industry. As used herein, "GWP" is a relative measure of the warming potential of a compound based on the structure of the compound. The GWP of a compound, as defined by the Intergovernmental Panel on Climate Change (IPCC) in 1990 and updated in 1998 (World Meteorological Organization, *Scientific Assessment of Ozone Depletion:* 1998, Global Ozone Research and Monitoring Project—Report No. 44, Geneva, 1999), is calculated as the warming due to the release of 1 kilogram of a compound relative to the warming due to the release of 1 kilogram of $CO_2$ over a specified integration time horizon (ITH):

$$GWP_x(t') = \frac{\int_0^{ITH} F_x C_{ox} e^{-t/\tau x} dt}{\int_0^{ITH} F_{CO_2} C_{CO_2}(t) dt}$$

where F is the radiative forcing per unit mass of a compound (the change in the flux of radiation through the atmosphere due to the IR absorbance of that compound), C is the atmospheric concentration of a compound, $\tau$ is the atmospheric lifetime of a compound, t is time and x is the compound of interest (i.e., $C_{0x}$ is the time 0 or initial concentration of compound x).

The commonly accepted ITH is 100 years representing a compromise between short-term effects (20 years) and longer-term effects (500 years or longer). The concentration of an organic compound in the atmosphere is assumed to follow pseudo first order kinetics (i.e., exponential decay). The concentration of $CO_2$ over that same time interval incorporates a more complex model for the exchange and removal of $CO_2$ from the atmosphere (the Bern carbon cycle model).

$CF_3CF_2C(O)CF(CF_3)_2$ has an atmospheric lifetime of approximately 5 days based on photolysis studies at 300 nm. Other perfluoroketones show similar absorbances and thus are expected to have similar atmospheric lifetimes. A measured IR cross-section was used to calculate the radiative forcing value for $CF_3CF_2C(O)CF(CF_3)_2$ based on the method of Pinnock, et al. (*J. Geophys. Res.*, 100, 23227, 1995). Using this radiative forcing value and the 5-day atmospheric lifetime, the GWP (100 year ITH) for a perfluoroketone with 6 carbon atoms is 1 while the GWP for $C_2F_6$ is 11,400. The perfluoroketones of the invention typically have a GWP less than about 10. As a result of their rapid degradation in the lower atmosphere, the perfluorinated ketones have short lifetimes and would not be expected to contribute significantly to global warming. The low GWP of the perfluoroketones make them well suited for use as gases in a vapor reactor.

Additionally, the perfluoroketones can have low toxicity. For example, $CF_3CF_2C(O)CF(CF_3)_2$ has low acute toxicity based on short-term inhalation tests with rats. The $LC_{50}$ concentration of $CF_3CF_2C(O)CF(CF_3)_2$ was found to be 100,000 ppm in air based on four-hour exposure tests. In contrast, the $LC_{50}$ concentration of $NF_3$ was found to be 2,000 ppm in air in similar studies.

The following examples further describe the methods of using perfluoroketones to etch or dope substrates using a vapor reactor and to clean a vapor reactor. The examples are provided for exemplary purposes to facilitate understanding of the invention and should not be construed to limit the invention to the examples. Unless specified otherwise, all percentages are percent by weight.

EXAMPLES

Preparation, Sources for Organofluorine Compounds Evaluated

1. $CF_3CF_2C(O)CF(CF_3)_2$—1,1,1,2,4,4,5,5,5-nonafluoro-2-trifluoromethyl-pentan-3-one Into a clean dry 600 mL Parr reactor equipped with stirrer, heater and thermocouple were added 5.6 g (0.10 mol) of anhydrous spray-dried potassium fluoride (available from Sigma Aldrich Chemical Co., Milwaukee, Wis.) and 250 g of anhydrous diglyme (anhydrous diethylene glycol dimethyl ether, available from Sigma Aldrich Chemical Co.). The anhydrous potassium fluoride used in this synthesis, and in all subsequent syntheses, was spray dried, stored at 125° C. and ground shortly before use. The contents of the reactor were stirred while 21.0 g (0.13 mol) of $C_2F_5COF$ (approximately 95.0 percent purity, available from 3M Company, St. Paul, Minn.) was added to the sealed reactor. The reactor and its contents were then heated, and when a temperature of 70° C. had been reached, a mixture of 147.3 g (0.98 mol) of $CF_2\!=\!CFCF_3$ (hexafluoropropylene, available from Sigma Aldrich Co.) and 163.3 g (0.98 mol) of $C_2F_5COF$ was added over a 3.0 hour time period. During the addition of the hexafluoropropylene and the $C_2F_5COF$ mixture, the pressure was maintained at less than 95 psig (5700 torr-absolute). The pressure at the end of the hexafluoropropylene addition was 30 psig (2300 torr-absolute) and did not change over the 45-minute hold period. The reactor contents were allowed to cool and were one-plate distilled to obtain 307.1 g containing 90.6% 1,1,1,2,4,4,5,5,5-nonafluoro-2-trifluoromethyl-pentan-3-one and 0.37% $C_6F_{12}$ (hexafluoropropylene dimer) as determined by gas chromatography. The crude fluorinated ketone was water-washed, distilled, and dried by contacting with silica gel to provide a fractionated fluorinated ketone of 99% purity and containing 0.4% hexafluoropropylene dimers.

A fractionated fluorinated ketone made as described above was purified of hexafluoropropylene dimers using the following procedure. Into a clean dry 600 mL Parr reactor equipped with stirrer, heater and thermocouple were added 61 g of acetic acid, 1.7 g of potassium permanganate, and 301 g of the above-described fractionated 1,1,1,2,4,4,5,5,5-nonafluoro-2-trifluoromethyl-pentan-3-one. The reactor was sealed and heated to 60° C., while stirring, reaching a pressure of 12 psig (1400 torr-absolute). After 75 minutes of stirring at 60° C., a liquid sample was taken using a dip tube, the sample was phase split and the lower phase was washed with water. The sample was analyzed using glc and showed undetectable amounts of hexafluoropropylene dimers and small amounts of hexafluoropropylene trimers. A second sample was taken 60 minutes later and was treated similarly. The glc analysis of the second sample showed no detectable dimers or trimers. The reaction was stopped after 3.5 hours, and the purified ketone was phase split from the acetic acid and the lower phase was washed twice with water. 261 g of the ketone was collected, having a purity greater than 99.6% by glc and containing no detectable hexafluoropropylene dimers or trimers.

2. $CF_3C(O)CF(CF_3)_2$—1,1,1,3,4,4,4-heptafluoro-3-trifluoromethylbutan-2-one

A mixture consisting of 421 g of trifluoroacetic anhydride (available from Sigma Aldrich Co.), 319.5 g of anhydrous diglyme, 131 g of anhydrous potassium fluoride and 315 g of hexafluoropropylene was heated in a 3-liter HASTELLOY™ pressure vessel (Haynes, Inc., Kokomo, Ind.) under autogenous pressure at 50° C. for 16 hours. The gaseous product was fractionally distilled to give 319.1 g of 1,1,1,3,4,4,4-heptafluoro-3-trifluoromethyl-butan-2-one having a boiling point of 25° C. Purity was 99.6% as determined by gas chromatography. The structure was verified using nuclear magnetic resonance spectroscopy.

3. $CF_3CF_2CF_3$—perfluoropropane

Perfluoropropane is available with 99+% purity from Fluorochem USA, West Columbia, S.C.

4. $c-C_4F_8O$—c-octafluorotetramethylene oxide c-Octafluorotetramethylene oxide is available from 3M Company, St. Paul, Minn.

Examples 1–2 and Comparative Examples C1–C2

Two perfluoroketones of this invention, $CF_3C(O)CF(CF_3)_2$ and $CF_3$—$CF_2C(O)CF(CF_3)_2$, were compared to two known cleaning gases, perfluoropropane ($C_3F_8$) and c-octafluorotetramethylene oxide ($c-C_4F_8O$). The gases were compared for their ability to remove silicon based deposits from a CVD chamber that had been used previously with perfluorochemicals to prepare various dielectric materials.

A Plasma Lab uP chemical vapor deposition (CVD) chamber (available from PLASMAtech, Inc., Erlanger, Ky.) was equipped with a Fourier transform infrared spectrometer capable of analyzing exhaust emissions from the chamber over time during a plasma cleaning process. For all of the experiments, the power was kept constant at 250 watts, the pressure was maintained at 0.1 torr-absolute, and each organofluorine test gas was mixed with oxygen gas at a 0.33 volumetric ratio. Initially, the RF power was kept off and the organofluorine/oxygen gas mixture was allowed to pass through the chamber and spectrometer unreacted. Then the RF power was turned on and a plasma was formed. The gas mixture was allowed to react. The mass of each cleaning gas delivered to the chamber and exhausting from the chamber (including degradation products) was determined. Flow rates were chosen such that the cleaning rates of the various gases were comparable based on the concentration of $SiF_4$ in the exit stream. As a result, flow rates of the perfluoroketones could be significantly lower than the flow rates for either $C_3F_8$ or $c-C_4F_8O$ to achieve the same rate of cleaning.

The utilization efficiency of each cleaning gas was calculated using the formula given below:

$$\% \ Utilization = \frac{[C_xF_yO_z{}_{RF-OFF}] - [C_xF_yO_z{}_{RF-ON}]}{[C_xF_yO_z{}_{RF-OFF}]} \times 100$$

where $[C_xF_yO_z]$ represents the molar concentration of the cleaning gas measured before and after the RF power is turned on. A higher percent utilization is desirable to maximize performance of the cleaning gas in the plasma and to minimize emission of PFC greenhouse gases.

The PFC emissions were measured for each cleaning gas. The emissions were normalized based on the emissions from perfluoropropane. The utilization efficiency was also calculated. The data in TABLE 1 show that the perfluoroketones provide a higher utilization efficiency and also offer a very significant 97–98% reduction in PFC emissions compared to $C_3F_8$ or $c-C_4F_8O$.

TABLE 1

Comparison of Cleaning Gases at Same Rate of Cleaning

| Ex. | Etch Gas | Flow Rate (sccm) | % Utilization | Relative PFC Emissions | % Reduction of PFC Emissions |
|---|---|---|---|---|---|
| 1 | $CF_3C(O)CF(CF_3)_2$ | 23 | 40 | 0.03 | 97 |
| 2 | $CF_3CF_2C(O)CF(CF_3)_2$ | 19 | 38 | 0.02 | 98 |
| C1 | $c-C_4F_8O$ | 45 | 25 | 0.95 | 5 |
| C2 | $C_3F_8$ | 80 | 13 | 1 | 0 |

For $CF_3C(O)CF(CF_3)_2$, the effect of cleaning gas flow rate on $SiF_4$ removal rate (normalized to a flow rate of 35 sccm) and cleaning gas utilization efficiency are shown in TABLE 2. During these five experiments, the CVD chamber pressure was maintained at 0.1 torr-absolute, RF power was set at 250 watts and each organofluorine test gas was mixed with oxygen gas at a 0.33 volumetric ratio.

TABLE 2

Variation of Cleaning Gas Flow Rate

| Flow Rate (sccm) | Normalized $SiF_4$ Removal Rate | % Utilization |
|---|---|---|
| 35 | 1 | 40 |
| 23 | 1 | 40 |
| 18 | 0.92 | 41 |
| 12 | 0.75 | 41 |
| 9 | 0.7 | 42 |

The data in TABLE 2 show that the utilization efficiency of the perfluorinated ketone cleaning gas was nearly independent of gas flow rate, and the normalized $SiF_4$ removal rate was slightly lower at lower cleaning gas flow rates. These results indicate that the perfluroketones of this invention can be used as very low flow rates to effectively remove silicon based materials from a CVD chamber.

Examples 3–4 Comparative Examples C3–C4

The same test procedure and candidate evaluation was conducted as described in Examples 1–2 Comparative Examples C1–C2, except for this experimental series silicon oxide-treated wafer were etched in the CVD chamber. Again, the CVD chamber pressure was maintained at 0.1 torr-absolute, RF power was set at 250 watts and each organofluorine test gas was mixed with oxygen gas at a 0.33 volumetric ratio.

To conduct the etch gas study, oxidized silicon wafers were first prepared, having a thermally grown silicon dioxide layer of approximately 10,000 angstroms thickness. The silicon wafers used were 8 inch (20 cm) diameter wafers, available from MEMC Electronic Materials, Inc. St. Peters, Mo. Thermal oxidation of each wafer was carried out at 1000° C. for approximately 5 hours in humidified oxygen gas. Oxide layer thickness was determined using a NANOMETRICS™ Nano Spec/AFT 180 ellipsometer (available from Nanometrics, Inc. Sunnyvale, Calif.)

For each etch gas, the silicon oxide-coated wafer was etched in the CVD chamber for 2 minutes, and the amount of silicon oxide removed from the wafer was determined by monitoring the $SiF_4$ emissions using FTIR. The flow rates were chosen to produce the same amount of $SiF_4$ for each etching gas. A much lower flow rate could be used with the perfluoroketones to achieve the same rate of etching. The PFC emissions were normalized based on the emissions for perfluoropropane. The perfluoroketones reduced the emissions by more than 95% compared to only a 5% reduction using c-$C_4F_8O$. The results are presented in TABLE 3.

TABLE 3

Comparison of Etching Gases at Same Rate of Etching

| Ex. | Etch Gas | Flow Rate (sccm) | Relative Amount of Silicon Oxide Removed | % Reduction of PFC Emissions |
|---|---|---|---|---|
| 3 | $CF_3C(O)CF(CF_3)_2$ | 23 | 1 | 97 |
| 4 | $CF_3CF_2C(O)CF(CF_3)_2$ | 19 | 1 | 98 |
| C3 | c-$C_4F_8O$ | 45 | 1 | 5 |
| C4 | $C_3F_8$ | 80 | 1 | 0 |

From the foregoing detailed description it will be evident that modifications can be made in the methods of the invention without departing from the spirit or scope of the invention. Therefore, it is intended that all modifications and variations not departing from the spirit of the invention come within the scope of the claims and their equivalents.

We claim:

1. A method of removing deposits from a vapor reactor comprising contacting the deposits with a plasma excited gas comprising a perfluoroketone having 4 to 7 carbon atoms.

2. The method of claim 1, wherein the reactive gas further comprises oxygen.

3. The method of claim 1, wherein the perfluoroketone has 5 to 7 carbon atoms.

4. The method of claim 3, wherein the perfluoroketone is selected from the group consisting of $CF_3CF_2C(O)CF_2CF_3$, $CF_3C(O)CF(CF_3)_2$, $CF_3CF_2C(O)CF(CF_3)_2$, $CF_3(CF_2)_2C(O)CF(CF_3)_2$, $(CF_3)_2CFC(O)CF(CF_3)_2$, perfluorocyclopentanone, perfluorocyclohexanone, and mixtures thereof.

5. The method of claim 3, wherein the perfluoroketone is $CF_3C(O)CF(CF_3)_2$.

6. The method of claim 3, wherein the perfluoroketone is $CF_3CF_2C(O)CF(CF_3)_2$.

7. The method of claim 1, wherein the perfluoroketone has a global warming potential less than about 10.

8. A method for etching a dielectric or metallic material in a vapor reactor comprising contacting the dielectric or metallic material with a plasma excited gas comprising a perfluoroketone having 4 to 7 carbon atoms.

9. The method of claim 8, wherein the reactive gas further comprises oxygen.

10. The method of claim 8, wherein the perfluoroketone has 5 to 7 carbon atoms.

11. The method of claim 10, wherein the perfluoroketone is selected from the group consisting of $CF_3CF_2C(O)CF_2CF_3$, $CF_3C(O)CF(CF_3)_2$, $CF_3CF_2C(O)CF(CF_3)_2CF_3$, $(CF_2)_2C(O)CF(CF_3)_2$, $(CF_3)_2CFC(O)CF(CF_3)_2$, perfluorocyclopentanone, perfluorocyclohexanone, and mixtures thereof.

12. The method of claim 10, wherein the perfluoroketone is $CF_3C(O)CF(CF_3)_2$.

13. The method of claim 10, wherein the perfluoroketone is $CF_3CF_2C(O)CF(CF_3)_2$.

14. The method of claim 8, wherein the dielectric or metallic material comprises a silicon-based material.

15. The method of claim 8, wherein the perfluoroketone has a global warming potential less than about 10.

* * * * *